United States Patent [19]

Rozylowicz

[11] 4,009,477

[45] Feb. 22, 1977

[54] WATTMETER HOUSING FOR A POWER CARRYING LINE

[75] Inventor: Edward Francis Rozylowicz, Villa Park, Ill.

[73] Assignee: Motorola, Inc., Schaumburg, Ill.

[22] Filed: Jan. 5, 1976

[21] Appl. No.: 646,452

[52] U.S. Cl. .............................. 324/156; 324/126; 324/157

[51] Int. Cl.$^2$ ........................................ G01R 1/04

[58] Field of Search ............ 324/95, 115, 127, 156, 324/157, 149, 126; 333/10

[56] References Cited

UNITED STATES PATENTS

| | | | |
|---|---|---|---|
| 2,836,793 | 5/1958 | Kelly | 324/156 X |
| 3,447,083 | 5/1969 | Luskow | 324/95 X |
| 3,657,650 | 4/1972 | Arndt | 324/127 X |

Primary Examiner—Gerard R. Strecker
Attorney, Agent, or Firm—James W. Gillman; Victor Myer

[57] ABSTRACT

A coupler series connects in the power line to be monitored. Sensing circuitry within the coupler senses power flow in each direction of the power line, and produces D.C. signals representing the magnitude thereof. The D.C. signals appear at contacts on the body of the coupler.

A housing is provided with a cavity for receiving the coupler. Contacts in the housing adjoin the cavity and are aligned to connect to the coupler contacts. A D.C. activated meter is mounted in the housing, and is electrically connected through a switch to the housing contacts.

In operation, the coupler is series connected in the line and, when power is to be monitored, it is secured within the housing. By operating the switch, a user may monitor power flow in either direction down the line.

14 Claims, 1 Drawing Figure

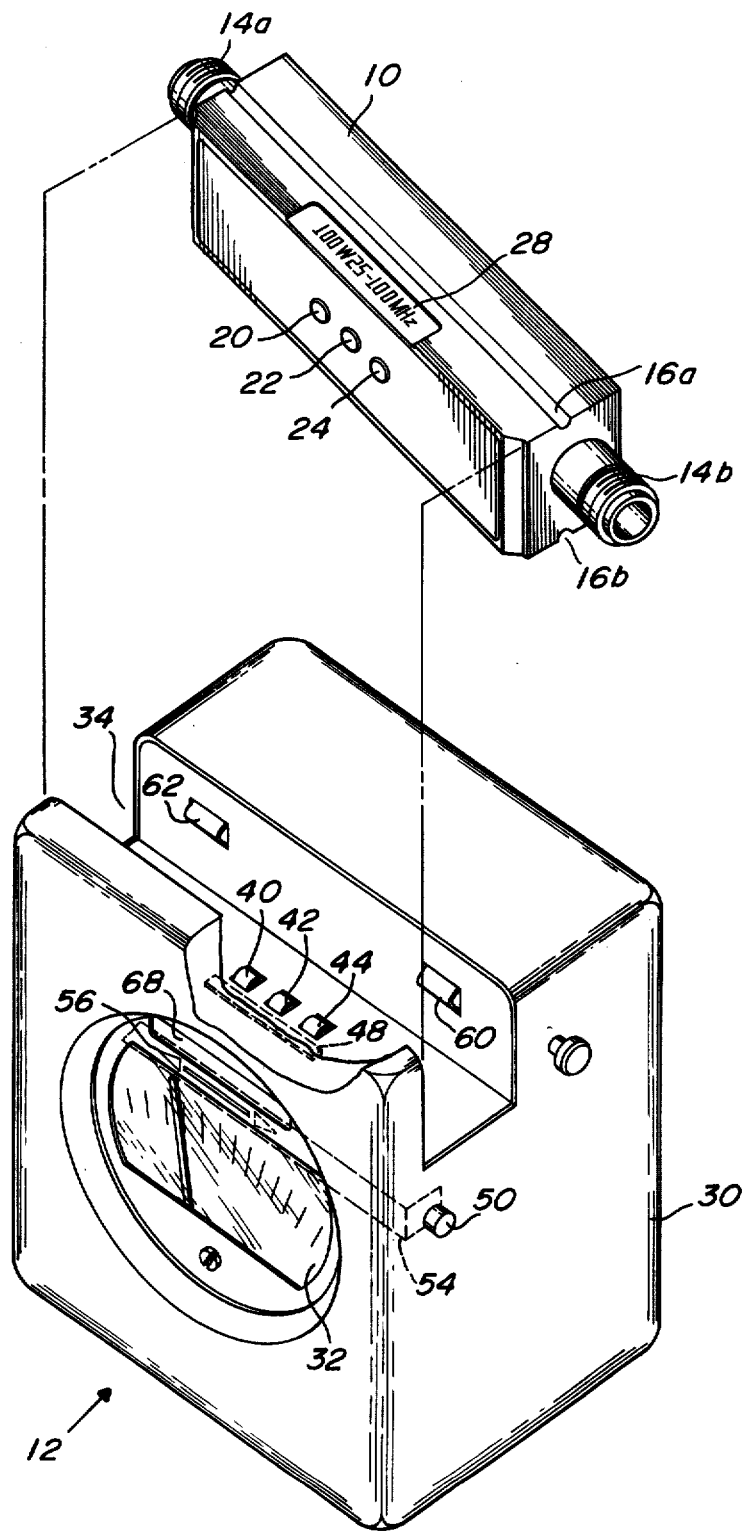

4,009,477

WATTMETER HOUSING FOR A POWER CARRYING LINE

BACKGROUND OF THE INVENTION

This invention pertains to the electrical power flow monitoring art, and, in particular, to a bidirectional power flow wattmeter.

Wattmeters adapted for measuring power flow along a line are well known in the art. Conventionally, wattmeters include a housing having jacks thereon for connection to the power line to be monitored. A coupler, which senses the power level on the line, is inserted within a housing aperture. In response to the A.C. power level sensed by the coupler, detection circuitry within the coupler generates a D.C. signal which in turn drives a D.C. meter, calibrated in power units, located within the housing. Such wattmeters have been inherently unidirectional, i.e. they measure net flow in one direction of the line at a time. When concurrent power flow in the opposite line direction is to be monitored, the power line connections to the wattmeter must be reversed.

Such prior art wattmeters are inconvenient to use. Whenever power along a given line is measured, the line must be broken and connected to the power meter, requiring a lengthy cessation in power flow. This is especially inconvenient in radio frequency transmitters, wherein a transmitting station must go off the air before power may be measured. Additionally, due to their unidirectional nature, prior art wattmeters do not provide a quick and convenient indication of forward and reverse power flow along the line.

OBJECTS OF THE INVENTION

It is an object of the invention, therefore, to provide an improved power flow measuring wattmeter.

It is a further object of this invention to provide the above described improved wattmeter which is adapted for measuring power flow along the line without the necessity of breaking the line, except for the initial one time installation within the line.

A further object of the invention is to provide the above described wattmeter which monitors forward and reverse power line flow concurrently.

Briefly, according to the invention, the wattmeter is comprised of a coupler and a meter. The coupler couples to the power line, and includes circuitry for sensing power flow therein. Detection circuitry within the coupler produces D.C. signals representative of the magnitudes of both forward and reverse power flow. These D.C. signals appear at contacts on the coupler body.

The meter is comprised of a readout device mounted within a housing. The housing is provided with a cavity for receiving the coupler. Contacts are provided in the housing, positioned directly and adjoining the cavity, for contacting the coupler contacts when the coupler is received within the cavity. A switch in the housing routes either the D.C. forward sense signal, or the D.C. reverse sense signal, to the D.C. activated readout.

In operation, the coupler may be permanently connected in the power line. When power is to be measured, the coupler is positioned into and secured within the housing cavity whereby, dependent on the position of the switch, power flow in either the forward or reverse direction is indicated via the readout.

BRIEF DESCRIPTION OF THE DRAWING

The single FIGURE illustrates both the coupler and meter, according to the invention, and the mechanical connection therebetween.

DESCRIPTION OF THE PREFERRED EMBODIMENT OF THE INVENTION

The drawing illustrates the wattmeter which is comprised of a coupler 10 and the meter 12.

The coupler is comprised of a rectangular and elongated metallic housing having connecting jacks 14a, 14b at both ends. Grooves 16a, 16b are provided in the vertical faces of the coupler, and extend across the length thereof. Three gold-plated electrical contacts 20, 22, 24 are fixed to and accessible from the bottom side of the coupler.

In operation, the coupler is series connected, in the line to be monitored, via connectors 14a and 14b. Circuitry (not shown) within the coupler senses the power travelling in both the forward and reverse directions on the line and produces D.C. signals representative of the magnitude of sensed power. Since the coupler is bidirectional in principle and construction, connector 14a can be the input or transmitter side with connector 14b the output or load side, or connector 14a can be the output or load side with connector 14b the input or transmitter side.

If connector 14a is the input side, the D.C. level representing forward power is coupled to contact 20 and the reflected or reverse power is coupled to contacts 24.

If connector 14b is the input side, the D.C. level representing forward power is coupled to contact 24 and the reflected or reverse power is coupled to contact 20.

Contact 22 is coupled to reference, or ground, potential.

While there are several circuits known in the art for sensing the power flow and producing a D.C. signal in response thereto, attention is drawn to the copending application Ser. No. 646,456 filed Jan. 5, 1976, assigned to the same assignee as the instant application, which discloses preferred coupler circuitry.

Indicia 28 on the body of the coupler 10 indicate relevant coupler parameters, e.g. power and frequency ratings and is viewable from both sides of the coupler.

The meter 12 is comprised of a housing 30 which is adapted for housing a power reading meter 32. Shown is a ballistic type D.C. activated meter. The housing 30 is also provided with a cavity 34 which is adapted for receiving coupler body 10. Three spring type contacts 40, 42 and 44 are located in the bottom portion of cavity 34, and are aligned to contact corresponding coupler contacts 20, 22 and 24 respectively, when the coupler is received within the cavity 34. A shorting bar 48 is located to be in contacting arrangement with each meter contact 40, 42, 44, thus shorting the contacts to one another, when the coupler 10 is withdrawn from the cavity 34. Connection is made from each contact 40 and 44 through a switch 50 to one side of the D.C. activated meter 32. Contact 42 is directly applied to the other side of meter 32. A shutter arrangement 54 mechanically couples to the switch 50 and selectively shutters one of the heads of a double headed arrow 56 which is observable through the front of the metering device.

A pair of springs 60, 62 are provided in the back vertical cavity face and are located such that when the coupler 10 is inserted within the cavity 34 the springs 60, 62 engage one of the grooves 16a, 16b depending on coupler insertion direction thereby securing the coupler within the housing 30. A window 68 is provided in the housing 30, and is aligned with the indicia 28 on the coupler whereby the indicia is viewable through the front face of the meter 12.

In operation, the coupler is series connected in the line to be monitored. When power on the line is to be monitored, the coupler 10 is received within the cavity 34, secured in place by the leaf spring 60, 62 engaging either one of the grooves 16a, 16b, and thereby securing the coupler contacts 20, 22, 24 to the housing contacts 40, 42, 44, respectively. A D.C. signal representing forward power is continuously available at contacts 20, 40 (or 24, 48 depending on coupler insertion) as is a D.C. signal representing the reverse power flow on contacts 24, 44 (or 20, 40). An actuator 50 controls a switch (not shown) which routes either the forward or reverse direction D.C. power signal to the readout meter 32. The direction of monitored power is indicated via the double headed arrow 56 and shutter mechanism 54. Also, the rating of the coupler is viewable via the indicia as observed through the provided window 68.

Since the coupler 10 and meter 12 are separate units, a coupler may be permanently installed in a line whereby power readings on that line may be monitored by simply mating coupler and meter. This obviates any need for breaking a line to take power measurements. Also, since the coupler circuitry concurrently detects both forward and reverse power, the switch, or actuator 50, and the shutter mechanism 54 provide a convenient way to bidirectionally readout this power.

Once the coupler 10 is withdrawn from the meter 12, the shorting bar 48 shorts the meter input contacts 40, 42, 44, thereby automatically electrically damping the meter for positive protection against mechanical shock or excessive vibration.

In summary, an improved wattmeter is disclosed which allows monitoring power on a line without breaking the line, and which provides a bidirectional power readout.

While a preferred embodiment of the invention has been described, it should be apparent that many modifications and variations thereto are possible, all of which fall within the true spirit and scope of the invention.

I claim:

1. Apparatus for measuring electrical flow on a line comprising:
   coupler means including
   a. a coupler body means adapted for permanent coupling to the line,
   b. sense means for sensing the electrical flow on the line and producing a sense signal representative of the magnitude thereof,
   c. first electrical contacting means affixed in a predetermined position with respect to said coupler body such that said contacting means does not project therefrom, and
   d. means coupling the sense signal to the first contacting means; and
   meter means including
   a. an electrical flow readout device,
   b. a housing means adapted for housing said readout device, said housing provided with a cavity adapted to receive said coupler body means,
   c. second contacting means located to electrically contact said first contacting means upon entrance of said coupler means into said housing cavity said second contacting means also being located within said cavity such that said second contacting means does not project therefrom, and
   d. coupling means, having an input connected to said second contacting means and an output connected to said readout device, for producing at its output a drive signal suitable for activating said readout device in response to sense signals at its input.

2. The apparatus of claim 1 wherein
   the sense means comprises detector means for producing a D.C. sense signal and
   the readout device comprises a D.C. operated meter.

3. The apparatus of claim 1 wherein
   the sense means comprises first means for sensing electrical flow in one direction on the line and producing a first sense signal in response thereto, and second means for sensing electrical flow in an opposite direction on the line and producing a second sense signal in response thereto,
   the first contacting means includes a first terminal and a second terminal,
   the coupling means couples the first sense signal to the first terminal and the second sense signal to the second terminal,
   the second contacting means includes first and second terminals for electrically contacting said first and second first contacting means terminals, respectively, and
   the coupling means comprises switch means for selectively producing said drive signal at its output in response to either the first or second sense signal.

4. The apparatus of claim 3 wherein the meter means further comprises means sensing the switch means and producing an indication of the status thereof.

5. The apparatus of claim 1 wherein the sense means senses electric power flow and the readout means indicates power units.

6. The apparatus of claim 2 wherein the meter means further comprises
   means for shorting together all inputs to the meter when the coupler means is removed from the housing cavity.

7. The apparatus of claim 1 wherein the meter means further comprises
   means for securing the coupler in the housing cavity.

8. The apparatus of claim 1 wherein
   the coupler means further comprises indicia on its body indicating relevant coupler parameters, and
   the meter means further comprises a window provided in the housing for observing said indicia when the coupler is received within the cavity.

9. A wattmeter for measuring power flow on a line comprising
   a coupler adapted for permanent series connection in the line, said coupler having means for sensing power flow on the line and producing a corresponding D.C. sense signal in response thereto, said coupler further provided with terminals, which do not project from the coupler, to which the D.C. sense signal is coupled, and a meter having a housing, a D.C. activated power readout device mounted in the housing, a provided housing cavity adapted for receiving the coupler, and means for coupling the coupler D.C. sense signal to the readout device when the coupler is received in the cavity, said means including terminal contacts located within the cavity such that they do not project therefrom.

10. The wattmeter of claim 9 wherein
the coupler produces a first D.C. sense signal responsive to power flow in a first direction on the line and a second D.C. sense signal responsive to power flow in the opposite direction, and
said meter further comprises a switching means operable to couple either the first or second D.C. sense signal to the readout device.

11. The wattmeter of claim 10 wherein the meter further comprises means responsive to the status of the switch for producing an indication of power flow in either direction on the line.

12. The wattmeter of claim 9 wherein the meter further comprises means for shorting together each readout means input in response to withdrawal of the coupler from the cavity.

13. The wattmeter of claim 9 wherein the meter further comprises means for securing the coupler in the cavity.

14. The wattmeter of claim 9 wherein
the coupler further comprises indicia on its body indicating relevant coupler parameters, and
the meter further comprises a window provided in the housing for observing said indicia when the coupler is received within the cavity.

* * * * *